United States Patent
Mukhopadhyay et al.

(10) Patent No.: US 7,508,697 B1
(45) Date of Patent: Mar. 24, 2009

(54) SELF-REPAIRING TECHNIQUE IN NANO-SCALE SRAM TO REDUCE PARAMETRIC FAILURES

(75) Inventors: Saibal Mukhopadhyay, Yorktown Heights, NY (US); Hamid Mahmoodi, San Francisco, CA (US); Keejong Kim, West Lafayette, IN (US); Kaushik Roy, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 126 days.

(21) Appl. No.: 11/746,448

(22) Filed: May 9, 2007

(51) Int. Cl.
*G11C 11/00* (2006.01)

(52) U.S. Cl. .............. 365/154; 365/189.07; 365/189.09

(58) Field of Classification Search .............. 365/154, 365/189.7, 189.09
See application file for complete search history.

(56) References Cited

U.S. PATENT DOCUMENTS

| | | | |
|---|---|---|---|
| 6,809,968 B2 * | 10/2004 | Marr et al. | 365/185.24 |
| 7,200,030 B2 * | 4/2007 | Yamaoka et al. | 365/154 |

\* cited by examiner

*Primary Examiner*—Hoai V Ho
(74) *Attorney, Agent, or Firm*—William F. Bahret

(57) ABSTRACT

A self-repairing SRAM and a method for reducing parametric failures in SRAM. On-chip leakage or delay monitors are employed to detect inter-die Vt process corners, in response to which the SRAM applies adaptive body bias to reduce the number of parametric failures in a die and improve memory yield. Embodiments include circuitry for applying reverse body bias (RBB) to the SRAM array in the presence of a low inter-die $V_t$ process corner, thereby reducing possible read and hold failures, and applying forward body bias (FBB) to the array in the presence of a high inter-die $V_t$ process corner, thereby reducing possible access and write failures.

4 Claims, 10 Drawing Sheets

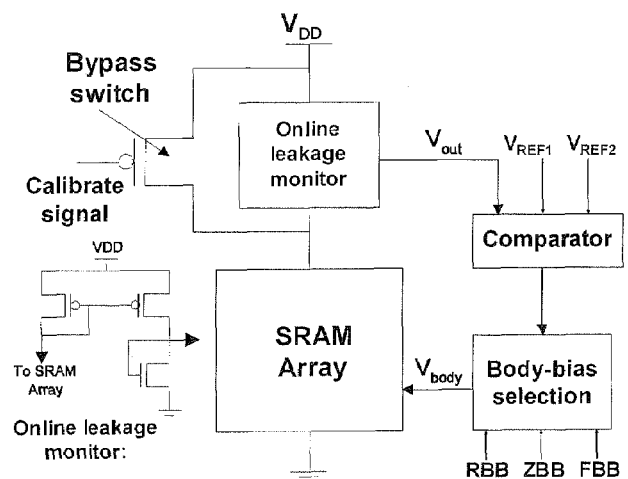
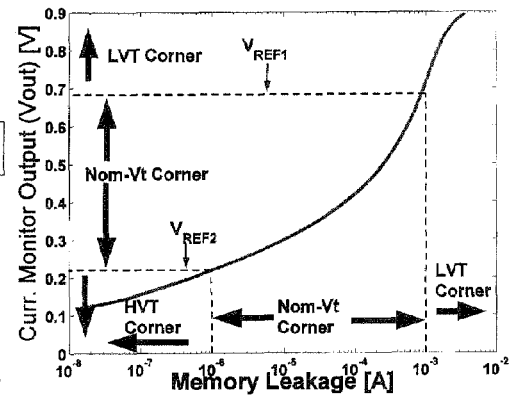
FIG 5A
FIG. 5B
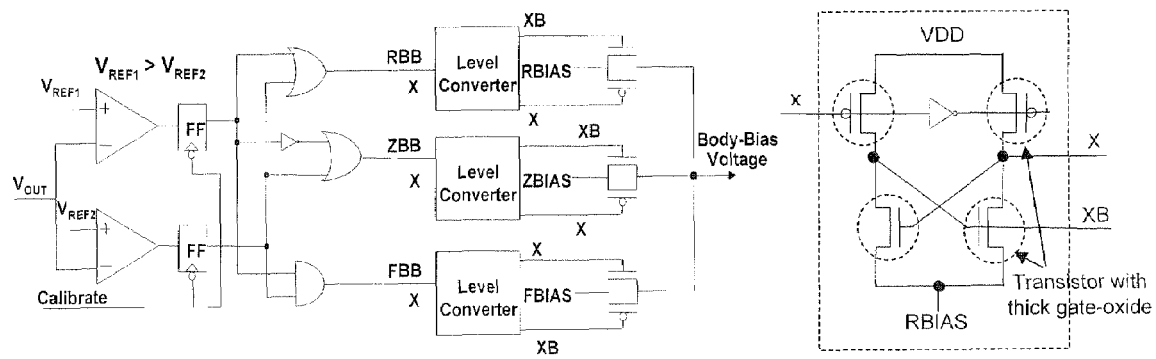
FIG.6A
FIG. 6B

SELF-REPAIRING TECHNIQUE IN NANO-SCALE SRAM TO REDUCE PARAMETRIC FAILURES

BACKGROUND OF THE INVENTION

This invention relates to techniques for reducing parametric failures and improving yield in nano-scale SRAM and other electronic devices, and more particularly to self-compensating—or self-repairing—techniques for reducing parametric failures and improving production yield in such devices.

Technology scaling has increased and continues to increase the performance of semiconductor devices, but, with increased scaling, process variations including inter-die and intra-die variations become a significant problem, resulting in significantly more failures and lower yield. The success of technology scaling in the semiconductor industry, particularly for microprocessors, strongly depends on the ability to design large and robust on-chip memories, e.g., SRAM arrays, and so there is a need for improved techniques for reducing parametric failures and improving yield.

As discussed in more detail below, die-to-die and within-die variations in process parameters result in mismatch in the strengths of different transistors in an SRAM cell, one of which is depicted schematically in FIG. 1, resulting in functional failures (read, write, access and hold failures). The functional failures due to parametric variations (hereafter referred to as parametric failures) degrade the memory yield (i.e., the number of non-faulty chips). Due to small geometry of the cell transistors, the principal reason for parametric failures is the within-die or intra-die variation in threshold voltage Vt of the cell transistors due to random dopant fluctuations (RDF). The die-to-die variation in process parameters (say, Vt) also has a strong impact on the failure probability of a cell. In particular, low-Vt dies have a higher probability of read and hold failures while high-Vt dies suffer mostly from access and write failures. Thus die-to-die variations significantly increase the yield degradation.

Redundancy is an effective way to reduce the failure probability but it naturally tends to offset the gains achieved from scaling. Thus, other ways are needed to improve yield with nano-scale devices.

SUMMARY OF THE INVENTION

The present invention provides a self-repairing device and technique for reducing SRAM failures, for example, the read/hold failures in low-Vt dies and access/write failures in high-Vt dies, and thereby considerably improves yield. This is achieved by using an adaptive repairing technique such as the application of Adaptive Body Bias (ABB).

One aspect of the present invention is a device and method for reducing parametric failures in SRAM, comprising measuring leakage current of a SRAM array with an on-chip leakage monitor, comparing the leakage current of the array to reference values corresponding to low and high inter-die $V_t$ process corners, applying reverse body bias (RBB) to the array if the comparison indicates a low inter-die $V_t$ process corner, and applying forward body bias (FBB) to the array if the comparison indicates a high inter-die $V_t$ process corner.

Another aspect of the present invention is a device and method for reducing parametric failures in SRAM, in which a long inverter chain is provided on a die with an array of SRAM cells, the delay in signal propagation through the inverter chain is measured and compared to reference values corresponding to low and high inter-die $V_t$ process corners, and reverse body bias (RBB) is applied to the SRAM array if the comparison indicates a low inter-die $V_t$ process corner, whereas forward body bias (FBB) is applied to the SRAM array if the comparison indicates a high inter-die $V_t$ process corner.

A general object of the present invention is to provide improved SRAM and like devices.

Another object is to reduce parametric failures and improve production yield in SRAM and like devices.

These and other objects and advantages of the present invention will be more apparent upon reading the following detailed description in conjunction with the accompanying drawings.

BRIEF DESCRIPTION OF THE DRAWINGS

FIG. 5A shows a self-repairing SRAM using ABB, and FIG. 5B shows the inter-die Vt shift and current monitor output.

FIG. 6 shows a body-bias generation circuit for the self-repairing SRAM of FIG. 5A: (A) body-bias selection logic, (b) level converters.

DESCRIPTION OF PREFERRED EMBODIMENTS

Figure 1:
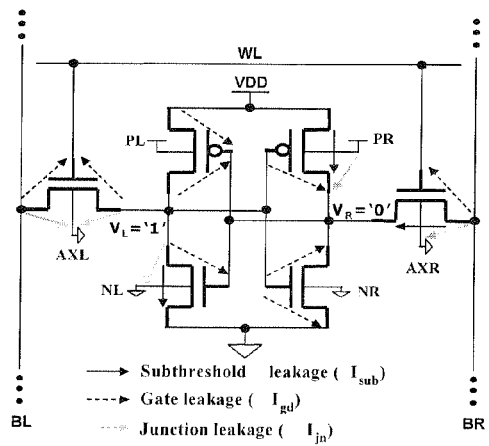
FIG. 1 is a sample schematic illustration of an SRAM Cell storing "0" at a node R.

For the purpose of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device and such further applications of the principles of the invention as illustrated therein being contemplated as would normally occur to one skilled in the art to which the invention relates.

A preferred embodiment of the present invention is a self-repairing technique in SRAM that uses Adaptive Body Bias (ABB) to reduce read/hold failures in low-Vt dies and access/write failures in high-Vt dies and thereby considerably improve yield. Application of Reverse-Body-Bias (RBB) in low-Vt dies increases their Vt thereby reducing possible read/hold failures in SRAM cells. Similarly, application of Forward Body Bias (FBB) in high-Vt dies decreases their Vt, which reduces the number of SRAM cells failing due to access and write failures. The technique detects the inter-die Vt corner of a die even under presence of large intra-die variation. An embodiment of a self-repairing SRAM according to the present invention successfully detects the inter-die Vt corners by monitoring the leakage of a memory array or delay of a ring-oscillator. Using delay and leakage monitoring, the SRAM applies proper body bias to reduce the number of parametric failures in a die and improves memory yield. The design is described in more detail below, and several aspects thereof are also described in the following paper which is hereby incorporated by reference in its entirety along with all references cited therein: S. Mukhopadhyay et. al, "Design of Reliable and Self-Repairing SRAM in Nano-scale Technologies using Leakage and Delay Monitoring," *International Test Conference (ITC)*, 2005, November, 2005. The proposed self-repairing SRAM is implemented in IBM 0.13 (m CMOS technology. Design and measurement of the test-chip successfully demonstrate the operation of the self-repair system.

As noted above, random within-die variation in process parameters (principally, Vt variation due to random dopant fluctuations) results in different types of parametric failures in an SRAM cell. The parametric failures in SRAM are principally due to access failure (reduction in the bit-differential produced while accessing the cell), read failure (data flipping while reading), write failure (unsuccessful write), and hold failure (data flipping at a lower supply voltage in standby mode), as discussed by S. Mukhopadhyay et. al. in "Modeling of Failure Probability and Statistical Design of SRAM Array for Yield Enhancement in Nanoscaled CMOS," *IEEE Transaction on Computer Aided Design*, vol. 24, no. 12, December 2005, 1859-1880, hereby incorporated by reference. An SRAM cell can fail due to any of the above four mechanisms. A column of an SRAM array is defined to be faulty if any of the cells in that column is faulty. An entire SRAM array is said to be faulty (memory failure) if number of faulty column is more than the number of redundant column (assuming column redundancy).

Figure 2A:
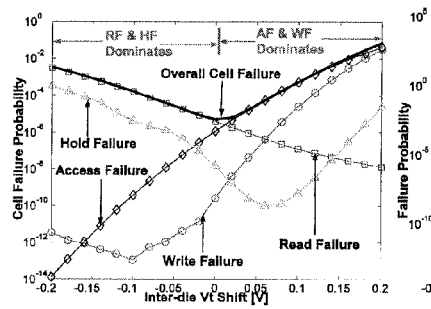
FIG. 2 shows the effect of inter-die Vt shift and body-bias on the failure probabilities: (A) cell failure probability with inter-die Vt shift, (B) memory failure probability with inter-die Vt shift, and (C) effect of body-bias on cell failure.
Figure 2B:
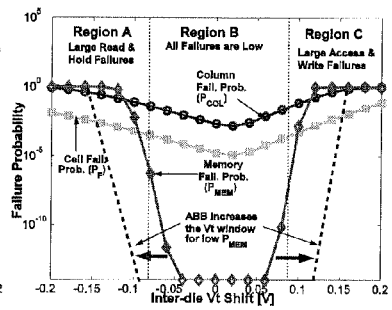

Proper sizing of the cell transistor can reduce the failure (due to within-die variation) probability of a cell at nominal inter-die corner. However, the global inter-die variation in process parameter (such as Vt) can amplify the effect of local random variation. FIGS. 2A and 2B illustrate the effect of inter-die Vt shift on cell failure probability and memory failure probability, respectively. In this example, using BPTM 70 nm predictive technology (Berkeley Predictive Technology Model), a certain amount of Vt shift was applied to all the transistors in an SRAM cell (represents inter-die Vt shift), followed by application of random intra-die Vt variation to each transistor in the cell and estimation of different failure probabilities using the method proposed in the above-referenced paper by S. Mukhopadhyay et. al., "Modeling of Failure Probability and Statistical Design of SRAM Array for Yield Enhancement in Nanoscaled CMOS." At low inter-die Vt corner, read (lower static noise margin) and hold (higher subthreshold leakage of pull-down transistor) failures are more probable. At high inter-die Vt corners, due to reduction in the current of the access transistors, write and access failures are more probable, as can be seen in FIG. 2A. Hence, the failure probability of a cell and an SRAM array strongly depends on the inter-die process variations. At nominal inter-die corner, low cell failure probability (region B of FIG. 2B) makes memory failure very unlikely as the number of faulty columns is more likely to be less than that of redundant columns. If negative (large read/hold failures in region A) and positive (large access/write failures in region C) inter-die Vt shifts increase beyond a certain level, memory failure probability becomes very high. This example shows that shifting of the dies from region A and C to region B (i.e., region B is widened) using adaptive repair technique improves yield.

Figure 2C:
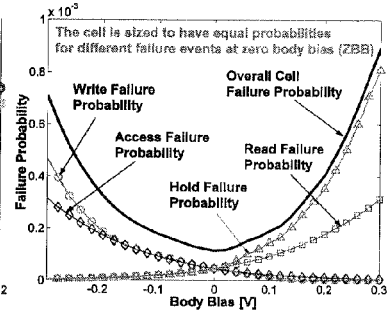

FIG. 2C illustrates the effect of body bias on cell failure probability. For simplicity, the example assumes application of body bias only to NMOS devices of an SRAM cell. Forward body bias reduces Vt of the access transistors, thereby reducing access and write failures for high-Vt dies in region C. On the other hand, reverse body bias increases Vt of the devices, thereby reducing read (higher static noise margin) and hold failures (lower subthreshold leakage) for low-Vt dies in region A. Hence, proper body bias can reduce the dominant types of failures in dies in region A and C and shift them to region B. One aspect of the present invention is a self-repairing technique for SRAM which detects the inter-die Vt corner of a die and applies proper body bias to reduce the number of failures. In accordance with this approach, detection and correction of global die-to-die variation are used to reduce the effect of local variation, thereby improving the yield.

Figure 3A:
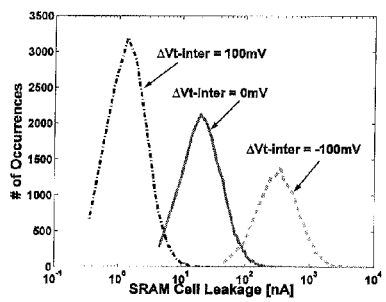
FIG. 3 shows the effect of random intra-die Vt variation at different inter-die Vt corners of SRAM: (A) leakage distribution (due to intra-die variation) of an SRAM cell, (B) leakage distribution (due to intra-die variation) of the 1 KB SRAM array, (C) minimum memory size vs. intra-die distribution.
Figure 3B:
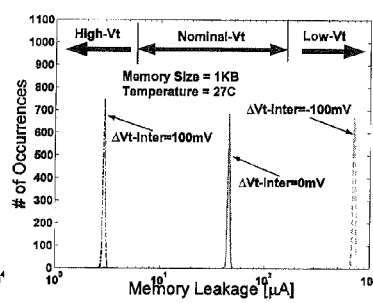

The detection of the inter-die Vt corner (in the presence of large intra-die Vt variation due to RDF) of a die is achieved by monitoring the leakage of a large SRAM array (instead of monitoring the leakage of a single transistor or cell) or the delay of a long inverter chain (instead of a single one). Leakage distribution due to random within-die Vt variation of a cell from low inter-die Vt corner can overlap with that of a cell from high inter-die Vt corner (FIG. 3A). However, since leakage of a large SRAM array is the sum of the leakage of all the cells, the leakage distribution of the arrays (due to within-die Vt variation) from different inter-die corners are well separated (FIG. 3B). This essentially follows from the Central Limit Theorem. See, e.g., Papoulis, *Probability, Random Variables and Stochastic Process*, McGraw-Hill, 2002.

Figure 4A:
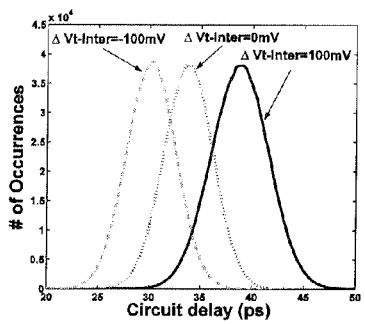
FIG. 4 illustrates Vt-binning with monitoring the delay of an inverter-chain: (A) 3-stage inverter-chain, (B) 300-stage inverter chain, and (C) minimum number of stages for effective separation.
Figure 4B:
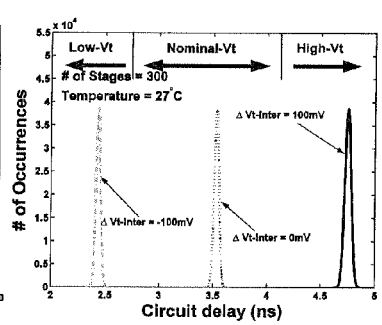

Similarly, for an inverter chain of small length (say, 3), the inter-die shift in the delay can be masked by the intra-die variation, as can be appreciated from FIG. 4A. However, for a long inverter chain (say, 300) the delay distributions (due to intra-die variations) are well separated (FIG. 4b). The following criteria are useful for determining the minimum array size (say $N_{min}$) required for effective separation (similar criteria may be used to determine minimum length of inverter chain):

Bins: Nominal-$Vt$:$-Vt_{bnd}$<$\Delta Vt_{iner}$<$Vt_{bnd}$

High-$Vt$:$\Delta Vt_{iner}$>$Vt_{bnd}$, Low-$Vt$:$\Delta Vt_{iner}$<$-Vt_{bnd}$, $N_{min}$ is given by the minimum $N_{Cell}$ for which:

1: $P[I_{MEM}(\Delta Vt_{iner}=Vt_{bnd})>I_{MEM}(\Delta Vt_{iner}=0)]<10^{-12*}$ 2: $P(I_{MEM}(\Delta Vt_{iner}=0)>I_{MEM}(\Delta Vt_{iner}=-Vt_{bnd}))<10^{-12}$

*$10^{-12}$ represents 7σ point of a Standard Normal Dist. (1)

Figure 3C:
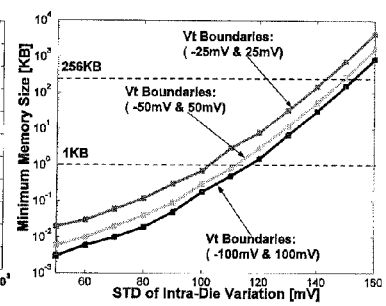
Figure 4C:
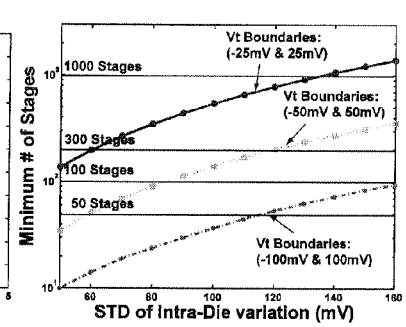

FIG. 3C and FIG. 4C show that larger than 1 KB memory array and more than 300 stage long inverter chain can provide good separation under reasonable variation. Hence, array leakage and/or delay of long inverter chain are reliable indicators of inter-die Vt corner even under large intra-die variation.

A preferred embodiment of a self-repairing SRAM according to the present invention uses leakage/delay monitors and adaptive body bias, with an on-chip process sensor that detects the inter-die process corner of the chip and accordingly applies an adaptive repair technique (e.g. proper body bias) to fix the parametric failures in that process corner.

Figure 7A:
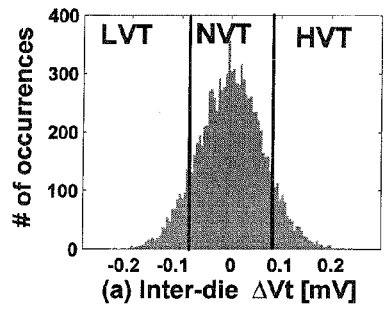
FIG. 7 illustrates the operation of the self-repair strategy: (A) Inter-die Vt distribution, (B) inter-die leakage distribution, (C) distribution of Vout, and (D) generation of ABB. (LVT—lowVt, NVT—nominal Vt, HVT—high Vt.
Figure 7B:
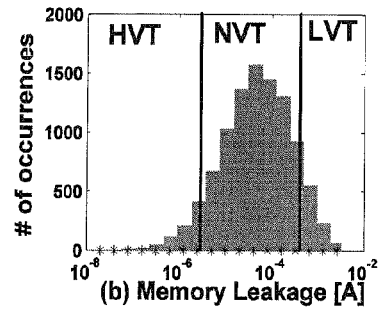
Figure 7C:
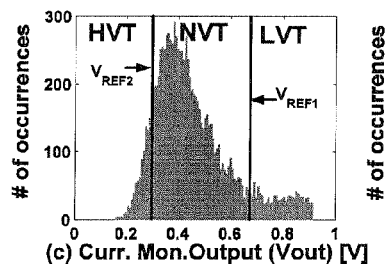
Figure 7D:
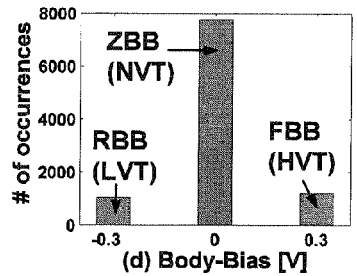

The schematic of one embodiment of a self-repairing SRAM array with leakage sensor is shown in FIG. 5A. A current sensor circuit monitors the leakage of the entire SRAM array and generates an output voltage (Vout) that is proportional to the leakage value, as shown in FIG. 5B, a simulation result for a simple current mirror circuit at predictive 70 nm technology. The output of the leakage monitor is compared with the reference voltages corresponding to the different inter-die process corners. A comparator circuit from http://ecircuitcenter.com/OpModels/V_Limit/) may be used in this embodiment. The reference voltages can be generated using bandgap voltage sources. Based on the results of this comparison, the body bias selection circuit applies the right body bias to the SRAM array (FIG. 6). A PMOS switch bypasses the leakage monitor during normal node of operation ("controlled" by calibrate signal). The output voltage generated by the leakage monitor is sampled by a set of flip-flops (FF) at the negative-going edge of the "calibrate" signal (which also turns "on" the bypass PMOS). If an SRAM die is in the low inter-die Vt corner, the output of the leakage monitor (Vout) will be greater than both the reference voltages ($V_{REF1}$ and $V_{REF2}$) and both comparators generate zero, resulting in application of a reverse body bias (RBB). Similarly, for a die in the high Vt corner, Vout will be less than both $V_{REF1}$ and $V_{REF2}$ and FBB will applied. For dies in the nominal Vt corner, zero body bias (ZBB) will be applied as $V_{REF2}$<$V_{OUT}$<$V_{REF1}$. Statistical simulation of the self-repairing technique has been performed in HSPICE using predictive 70 nm technology. First, using Monte-Carlo simulation, a large number (10000) of inter-die Vt shifts are generated for the SRAM array (FIG. 7A). The inter-die Vt distribution results in the inter-die distributions of the memory leakage (FIG. 7B), which results in different Vout voltage for dies in different inter-die corners (FIG. 7C). Finally, based on the comparator results in each die, the correct body bias is generated (FIG. 7D).

In the disclosed technique, the selection of the reference voltages is preferably based on the pre-calibration of the memory leakage at different inter-die process corners. Since intra-die variation shifts the mean of the leakage distribution from its nominal value, pre-calibration should consider the amount of intra-die variation. Moreover, the spread in $V_{out}$ due to random intra-die variation should be minimized. In the above simulation the Vout distribution for dies at the different Vt boundaries was well separated, increasing with an increase in the Vt boundaries and/or the memory size. However, variation in Vout, coupled with non-zero offset of the comparators, results in a finite probability of misdetection of the inter-die corner of a die. For example, a die which is actually in region A (or C) can be detected as a nominal Vt die if, due to within-die Vt variation, Vout becomes less than $V_{REF1}$ (or more than $V_{REF2}$). In such a case, instead of applying a RBB (or FBB), the self-repair system will apply a ZBB and the die will not be repaired. Simulation results show that the probability of this error is around 7% for a 1 KB SRAM array even for a large intra-die Vt variation. Increasing the memory size or the ΔVt window for region B reduces this probability. On the other hand, dies in region B also can be misdetected as in region A (or C) resulting in application of RBB (or FBB). This can shift the die to region A (or C) resulting in yield loss. For example, consider the case where a die is in negative-Vt part of a ZBB window. As the die shifts towards the region A, its probability of being misdetected as a low Vt die increases. However, for a nominal Vt die close to region A, application of RBB is less likely to shift it to region C (since region B window is reasonably large). It is easier for the dies closer to the zero Vt point (i.e., middle of region B) to be shifted to LVT region due to incorrect application of FBB. However, the dies near the middle of region B less likely to be misdetected. Hence, the possibility of yield loss due to transfer of dies from region B to A or C is very low, as verified from simulations (assuming large intra-die variation and ~50 mV comparator offset). Increasing array size and Vt boundaries will reduce this error further. In addition, a sense-amplifier-based comparator with offset compensation may be used where reduced offset voltage is desirable, as discussed below.

Figure 8A:
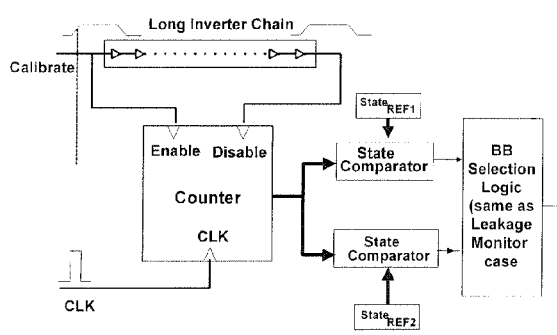
FIG. 8 shows a delay monitor for a self-repair circuit: (A) circuit configuration, (B) statistical operation.
Figure 8B:
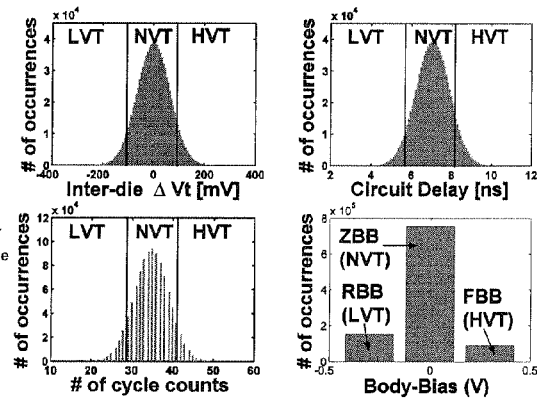

FIG. 8 shows a delay-monitor-based self-repair circuit which, in one embodiment, has a 600-stage long inverter chain or ring oscillator. Since the delay of a 600-stage ring oscillator is significantly higher than the clock-period, it is possible to use the clock and a counter-based detection technique. The counter is first initialized to zero state, and at the rising edge of the "calibrate" signal (which is synchronized with the rising edge of the clock) counting begins. The counter is disabled at the rising edge of the signal from the output of the final inverter. The total delay of the path is determined by the state of the counter. The final state of the counter is compared with pre-calibrated state values representing low-Vt and high-Vt corners (similar to $V_{REF1}$ and $V_{REF2}$) and proper body bias is applied. Monte-Carlo simulation is performed using predictive 70 nm technology to verify the proposed technique. The inter-die Vt distribution gets converted to the distribution of the final state of the counter (FIG. 8B). The digital comparator compares the final counter state with reference states and proper body bias is generated. Since the delay is measured in the quanta of the clock cycle, the number of stages should be large enough to minimize the quantization error, which can be further minimized using dual-edge triggered counters such as described by H. Mahmoodi, et al. in "Dual-edge triggered level converting flip-flops", ISCAS 2004, *IEEE International Symposium on Circuits and Systems*, vol. 2, pp. 661-664, May 2004, hereby incorporated by reference.

The delay-monitor-based design eliminates analog components such as a current mirror and comparators. The spread in the output state distribution and the shift in its mean value due to intra-die variation is very low in the delay monitor scheme. This not only minimizes the misprediction errors but also eliminates the need to consider the amount of random variation during pre-calibration of reference states. Moreover, the delay monitor does not require the additional bypass PMOS. However, with the delay monitor, linear dependence of delay on Vt reduces the difference between the output states for inverter chains shifted to different inter-die process corners (the difference in leakage is much higher due to exponential dependence of leakage to Vt). The complexity and area overhead of the delay monitor circuit (ring-oscillator, counter and comparator logic) is also higher than that of the leakage monitor system. In an alternative embodiment, the ABB-based yield enhancement technique may be implemented using off-chip selection and application (e.g., using programmable fuses) of body-bias voltages.

Figure 9A:
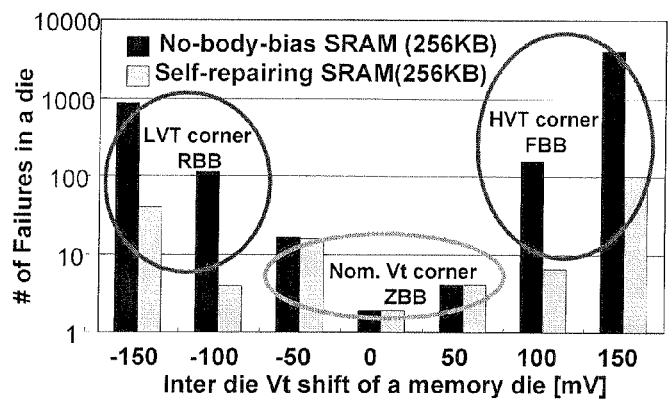
FIG. 9A illustrates the reduction in parametric failures for a 256 KB memory array using self-repairing SRAM.
Figure 9B:
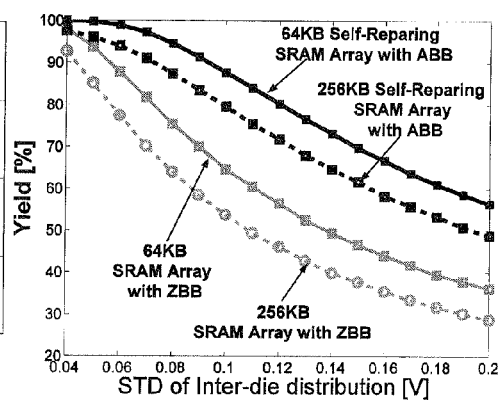
FIG. 9B shows the yield enhancement using self-repairing SRAM.

The disclosed self-repairing SRAM has been applied to 64 KB and 256 KB arrays designed with BPTM 70 nm technology and simulated in SPICE. The size of the transistors in the SRAM cell is optimized to minimize the cell failure probability at ΔVt-inter=0 mV (at zero body bias). The disclosed technique reduces the number of failures in low-Vt and high-Vt inter-die corners, which widens the low memory failure region, resulting in better yield (FIG. 9). The self-repair technique results in 5%-40% improvement in yield over the SRAM array with no body bias (FIG. 9). The effectiveness of the technique improves with an increase in the intra-die and inter-die variations.

Figure 10A:
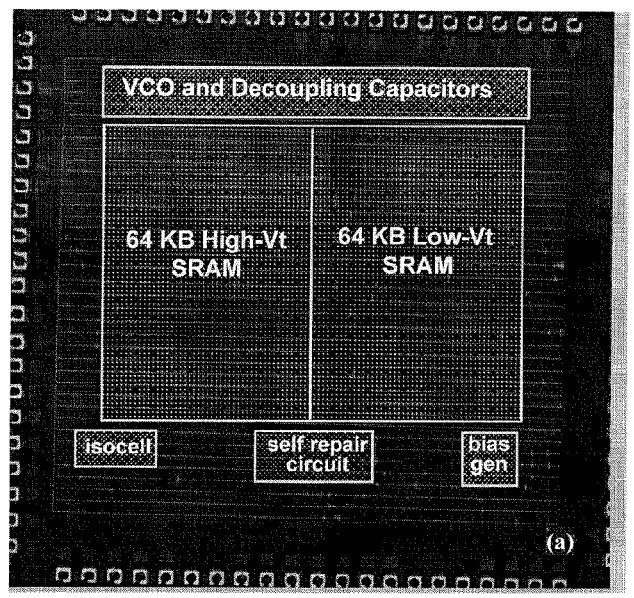
FIG. 10 illustrates the implementation of a self-repairing SRAM in accordance with the present invention: (A) Die-photo of self-repairing SRAM chip (Technology: 0.13 µm, Dual-Vt Triple-well technology, Die size: 16 mm$^2$, I/O Pin: 84, Number of Transistors: ~7 million), (B) full-chip layout, (C) 16 KB SRAM block layout, and (d) built-in test circuit layout.

FIG. 10 shows an example of a self-repairing SRAM in accordance with the present invention fabricated in IBM 0.13 μm CMOS technology. The dual-Vt option available in the technology is used to emulate inter-die process variations. Two 64 KB SRAMs are implemented, one using low-Vt (represents extreme negative Vt shift) and one with high-Vt (represents extreme positive Vt shift) devices. The self-repairing SRAM in this embodiment is implemented with a leakage monitor and on-chip body-bias generators.

Figures 10B, 10C, 10D:
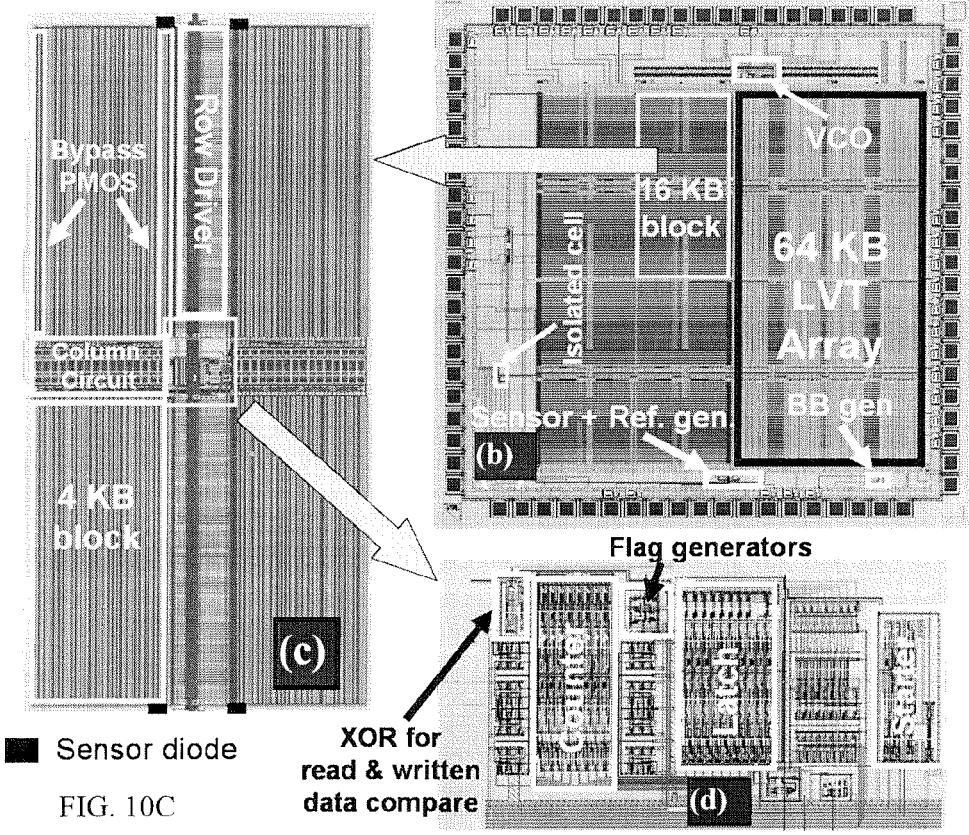
Figure 11A:
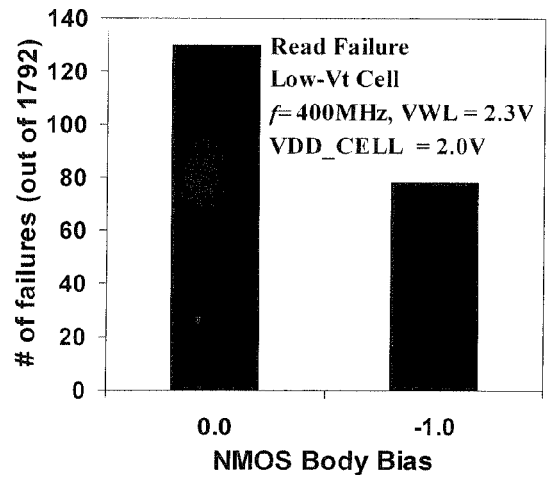
FIG. 11 illustrates failure measurement results for a 64 KB array with adaptive body bias fabricated in 0.13 M CMOS technology: (A) RBB reduces read failures in low-Vt array, (B) RBB reduces hold failures in low-Vt array, (C) FBB increases bit-differential (lower access failures) in high-Vt array, and (D) FBB reduces write failures in high-Vt array.
Figure 11B:
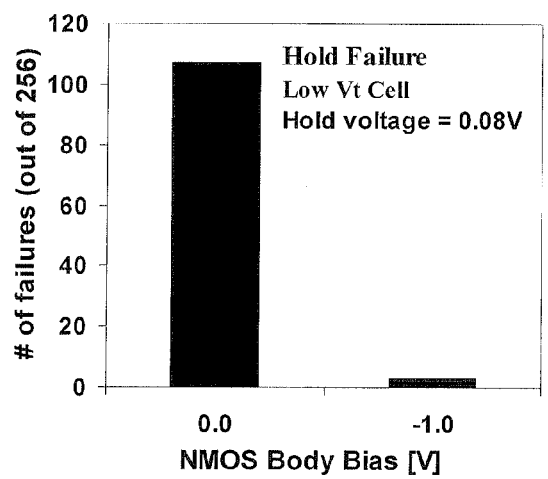
Figure 11C:
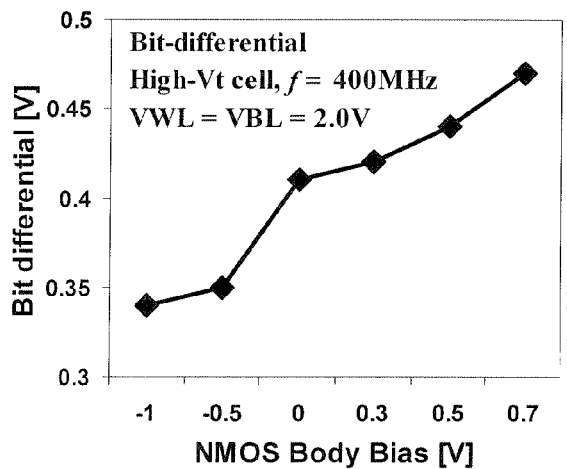
Figure 11D:
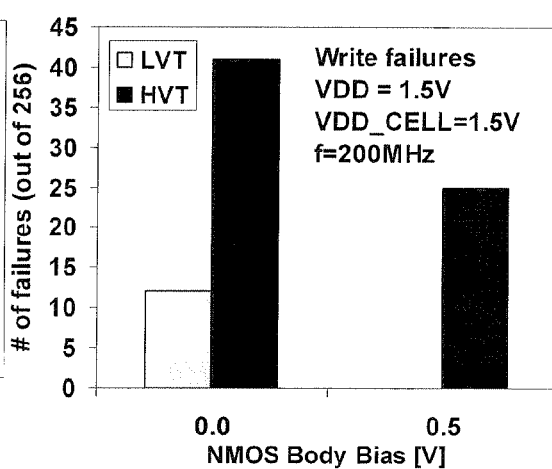

The two 64 KB arrays are each divided in four blocks of 16 KB (FIG. 10B). Each 16 KB block contains four blocks of 4 KB array (256 rows×128 columns) with column circuits (i.e., column decoder, read/write multiplexers, pre-charge circuit and sense amplifiers) and row drivers (essentially a 256 bit shifter). Each 16 KB block also contains a built-in test circuit (explained below) to test different types of failures (FIG. 10D). The bypass PMOS are designed so that they do not come in series with the pre-charge circuit (to reduce pre-charge delay overhead). It may be noted that the read delay is determined by the discharging current through the series connected access and pull-down NMOS devices. Hence, the bypass PMOS does not introduce additional delay penalty. The area overhead associated with the implementation of bypass PMOS transistors is approximately 5%.

Referring to FIG. 11, measurement results for the above circuit, described in more detail below, illustrate the effect of the disclosed self-repair technique on different cell failures. Based on the proposed scheme, RBB is applied to the low-Vt array, which reduces the read and hold failures for that array (FIGS. 11A-B). FBB is applied to the high-Vt array, which results in higher bit-differential (lower access failure) and lower write failure for that array (FIGS. 11C-D). The failure measurement results validate the effectiveness of the disclosed technique in repairing SRAM array and improving design yield.

Figure 12A:
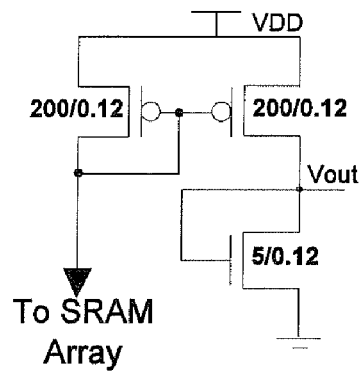
FIG. 12 shows a leakage sensor: (A) a sensor using diode connected load, (B) preferred leakage sensor, (C) bias generation circuit for the preferred leakage sensor.
Figure 12:
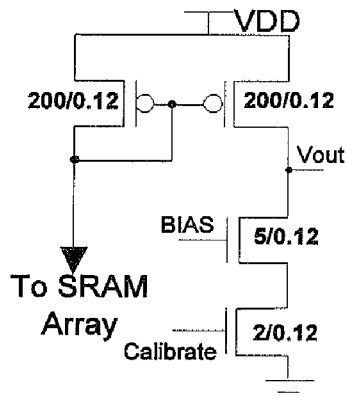

The current sensing circuit is essentially a current mirror with an active NMOS load (FIG. 12, designed using large devices to reduce RDF effect). The current sensor is designed to have Vout~1.4V for low-Vt array (RBB signal is generated) and Vout~0V for high-Vt array (FBB signal is generated). The diode in the current mirror circuit is designed to be large and distributed in different parts of the array (4 diodes are used for each of the 4 KB array with less than 0.01% area overhead) to reduce the effect of within-die random and spatial variability.

Figure 12C:
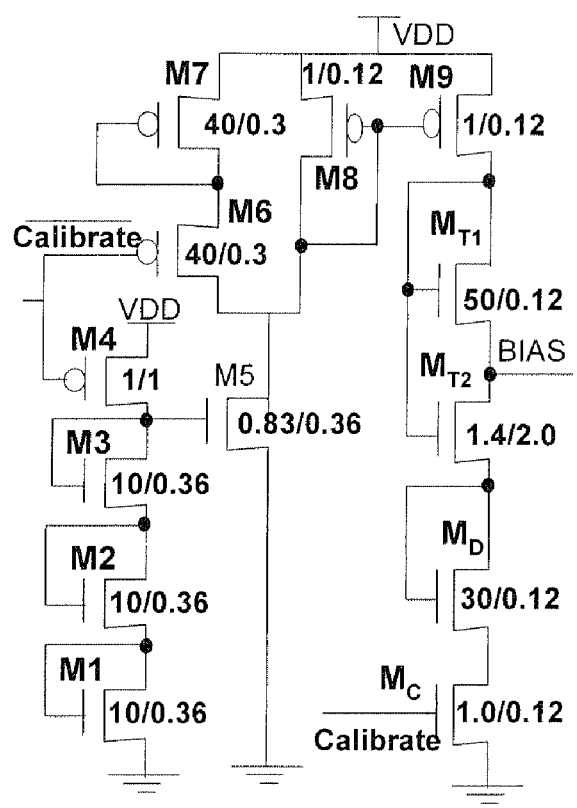

The leakage sensor output (Vout) is desired to have low sensitivity to (a) inter-die Vt shift in the sensor transistors, and (b) change in temperature (T). With a diode-connected NMOS load (FIG. 12A) positive inter-die Vt shift of the diode at the high-Vt corner increases Vout, and thus reduces the difference in Vout between low and high-Vt corners. Also, due to exponential dependence of array leakage on temperature, Vout for a high-Vt die at high T can be comparable to that of a low-Vt die at low T. Therefore, it is preferred to use an active NMOS load with variable bias, as shown in FIG. 12B. The bias generator circuit is designed such that the bias increases with T and inter-die Vt shift of sensor transistors (with $M_{T1}$, $M_{T2}$ and $M_D$ in FIG. 12C, $V_{BIAS}$~$kT\ln(W_{T1}/W_{T2})+Vt_{MD}$). This reduces the resistance of the NMOS load at higher temperature (lower sensitivity of Vout to T) and higher inter-die Vt (compensates the Vt increase of NMOS load). The transistors M1-M9 are designed to ensure a larger current through $M_{T1}$-$M_{T2}$-$M_D$ at low-Vt corner compared to high-Vt corner. This increases $V_{BIAS}$ at a faster rate with T for low-Vt cases to compensate the higher temperature sensitivity of array leakage at low-Vt corner. Simulations in 0.13 μm technology show that the sensor reduces the output sensitivity to temperature, inter-die and intra-die Vt variation of sensor transistors. The leakage sensor is designed to have Vout~1.4V for low-Vt array and Vout~0V for high-Vt array ($V_{DD}$=1.5V). To represent equal inter-die Vt shift, the array and the sensor are designed with the same types of devices (i.e., the sensor for low-Vt array is designed with low-Vt devices). As "Calibrate" switches from "high" to "low" during regular operation, the supply of the sensor is gated to minimize its static power dissipation.

Figure 13A:
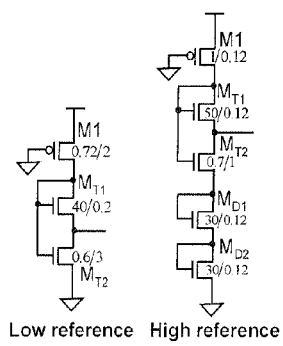
FIG. 13 shows a reference generator circuit: (A) circuit schematic, (B) effect of temperature and inter-die Vt shift (simulation result in 0.13 µm CMOS), (C) effect of change in supply voltage.
Figure 13B:
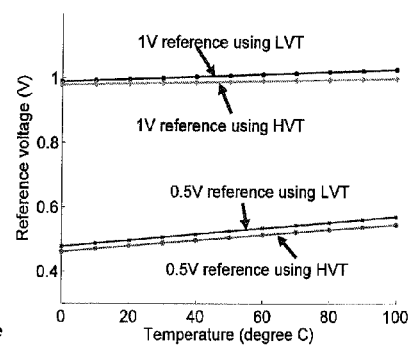
Figure 13C:
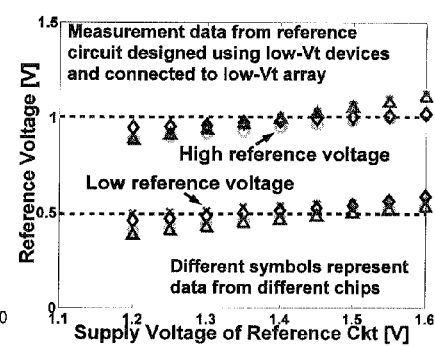

The on-chip reference voltages (e.g., 0.5V and 1V) preferably have a small positive temperature coefficient (similar to Vout, realized using NMOS $M_{T1}$ and $M_{T2}$) and low sensitivity to inter-die Vt shift, e.g., as shown in FIG. 13, which shows a small positive temperature coefficient of the reference voltage and its weak sensitivity to the inter-die Vt shift (FIG. 13B), and low sensitivity to supply variation and low chip-to-chip variation (FIG. 13C).

A sense-amplifier-based comparator with offset compensation is used in this embodiment of the self-repairing circuit to minimize the offset voltage. One such comparator is described in the following paper which is hereby incorporated by reference: B. Wicht, et al, "Yield and speed optimization of a latch type voltage sense amplifier", *IEEE Journal of Solid-State Circuits*, vol. 39, July, 2004, pp. 1148-1158. Returning to FIG. 6, the multiplexer logic in this embodiment is designed in light of the following considerations. Let us assume that the FBB generation signal is high (i.e., the die is in high-Vt corner) and RBB generation signal (i.e., selection signal for the top pass-transistors) is low. It should be noted that, if a negative RBB voltage is applied at the source of the pass transistors even if the gate of the NMOS is 0V, Vgs of the NMOS is |RBB|. Since the magnitude of RBB is expected to be larger than Vt of the NMOS, it will weakly turn on the NMOS. Therefore, even if only FBB generation signal is "high", the pass transistor corresponding to RBB will also be weakly "on". This will reduce the final body voltage from the applied FBB. To avoid this problem, the circuit of FIG. 6 uses a simple level converter circuit which changes all logic "0" values from 0V to the value of applied RBB. This ensures the NMOS in pass transistor corresponding to RBB selection remains "off" if RBB selection signal is low.

The circuit also includes FBB and RBB generators. To reduce the substrate noise originated from the high activity column (including read/write circuits and sense-amplifiers) and row driver circuits, they are designed in isolated p-well (using the triple-well option) and the array is placed in substrate, per K. Itoh, *VLSI Memory Chip*, Springer, 2001, hereby incorporated by reference in its entirety. Since in the disclosed design body bias is applied statically and the high-activity circuits are placed in triple-well, the fluctuation in the body current is low, which simplifies the on-chip design of the body-bias generators. Also, the nature of the memory-failure probability curve shown in FIG. 2B suggests that a large body-bias (upper bounded by maximum tolerable leakage values) can be used since the probability of shifting a die from region A to C (or vice-versa) is low (as region B is reasonably wide). Moreover, the sharp transition of PMEM $\sim \Delta Vt_{INTER}$ curve at the region boundary also suggests that a small change in the Vt is required to shift a large number of dies from region A and C to region B.

From the above observations, we conclude that the stability requirement of applied body-bias is less severe and that only two levels (one positive and one negative) of body bias can give significant yield improvement (a continuous value of output bias is not required from the bias-generators). The low stability requirement of the body voltage allows the design of bias generators using a reference circuit followed by an operational amplifier per Itoh, *VLSI Memory Chip*, referenced above. Measured FBB (e.g., +0.5V) and RBB (e.g., −0.5V) values from the on-chip bias generators show good stability against supply variation and the measured body bias values from different dies are also close to each other.

Figure 14A:
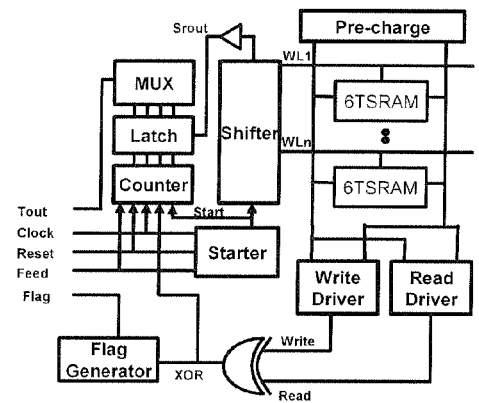
FIG. 14 shows a built-in test circuit for failure measurement: (A) schematic of the test circuit, (B) schematic of the starter block, and (C) simulation waveform of the test circuit operations (in 0.13 μm CMOS technology).
Figure 14:
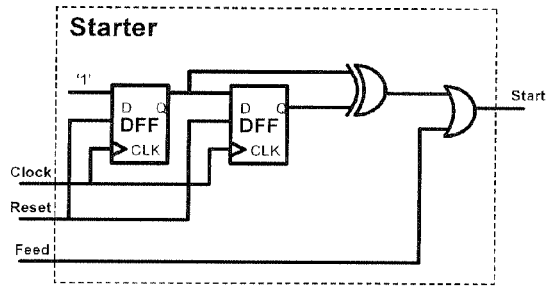
Figure 14C:
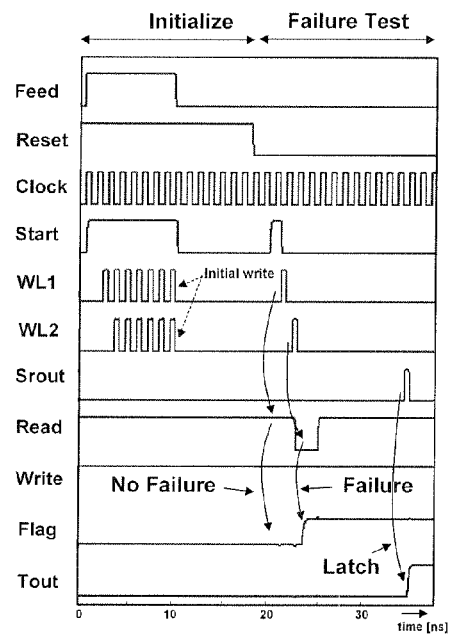

The self-repairing SRAM array may include a built-in test circuit as shown in FIGS. 10D and 14. One or more on-chip variable frequency oscillators may be provided to work with the test circuit. The variable frequency on-chip oscillator design may be based on the circuit proposed in the following paper and implemented for clock generation: H. R. Lee et al., "A fully integrated 0.13/spl mu/m CMOS 10 Gb Ethernet transceiver with XAUI interface," *International Solid State Circuit Conference,* 2004, hereby incorporated by reference. Depending on the input signals Reset, Feed and Clock the Starter block (FIG. 14B) either simultaneously turns "on" all the word-lines (which ensures a stable write to the cells) or turns "on" one WL at a time (for normal operation). When Feed=1 all the word-lines are turned "on" simultaneously and enough time is given to ensure a proper write operation. This step essentially initializes all the cells in the array. In the next step, Reset is set to zero and the negative edge of Reset generate a Start pulse with a pulse width equal to that of the Clock (generated using an on-chip/off-chip clock). This pulse propagates through the row driver circuit (which is essentially a 256 bit shifter) to turn "on" one word-line at a time. This pulse also resets the counter and flag generation circuit (FIG. 14A). At each clock cycle (i.e., when the word-line is "on" due to the start pulse), the cell in the selected row and column is read and the output of the sense-amplifier is compared against the written data (Write-In) (using a XOR circuit). If the read data is different from the written data, the XOR circuit generates a pulse indicating a failure. This sets the output of the flag generation circuit to "high" and advances the state of the counter. After the start pulse exits from the shifter (i.e., a pulse appears at srout) the counter is disabled and counter state is latched. The data stored in the latch indicates the total number of failures while flag indicates whether at least one failure exists. Initialization of the cells is performed at very low frequency to ensure proper write operation. The following read/write operations are performed at a given desired speed. For read failure testing, two consecutive read are performed (second read is performed at low speed to avoid access failure). To test for hold failure, after the initialization (i.e., the slow write), the supply voltage of the array is reduced to the desired hold voltage. After a sufficient time the voltage is increased back to the operational level and a slow (to avoid access failure) reading is performed to test for hold failures.

To predict access failure the bit-differential is measured using an additional sense-amplifier which is directly operated using the complement of the WL signal. After, the WL is turned "off", the sense amplifier becomes enabled and the voltage of the discharged bitline is compared against an external reference voltage ($V_{REF}$). If the voltage of the discharged bitline (BL) is less than $V_{REF}$, the OUT is high. If the voltage BL is higher than $V_{REF}$, then the OUT goes low. For a given clock frequency, by finding the reference voltage $V_{REF}$ at which the OUT is changing, the bit-differential at the time of sense-amplifier firing can be measured.

A self-repairing SRAM using on-chip current and delay monitoring techniques has been described. In the disclosed SRAM array, array-leakage and/or delay of an inverter chain are monitored and used to separate different SRAM dies in appropriate inter-die Vt corners. Adaptive body bias is applied to the dies in the different Vt corners resulting in a significant reduction in failures. The self-repairing SRAM with leakage monitors is designed and implemented in 0.13 μm CMOS technology. Measurement of a fabricated chip successfully demonstrates the operation of the self-repair system. Since parametric failures in SRAMs are becoming an increasing problem, the disclosed self-repairing SRAM can be very effective in achieving high yield in nano-meter technologies.

While the invention has been illustrated and described in detail in the drawings and foregoing description, the same is to be considered as illustrative and not restrictive in character, it being understood that only preferred embodiments have been shown and described and that all changes and modifications that come within the spirit of the invention are desired to be protected.

The following references are hereby incorporated by reference in their entireties along with all references cited therein:

[1] A. Bhavnagarwala, et. al., "The impact of intrinsic device fluctuations on CMOS SRAM cell stability," *IEEE J. Solid State Circuits*, vol. 36, no. 4, pp. 658-665, April 2001.

[2] J. W. Tschanz, et. al, "Adaptive body bias for reducing impacts of die-to-die and within-die parameter variations on microprocessor frequency and leakage," *IEEE JSSC.*, vol. 37, no. 11, November, 2002, pp. 1396-1402.

[3] J. T. Kao, et. al, "A 175-MV multiply-accumulate unit using an adaptive supply voltage and body bias architecture," *IEEE J. Solid State Circuits*, vol. 37, no. 11, November, 2002, pp. 1545-1554.

[4] R. Rao, et. al, "Parametric yield estimation considering leakage variability," *DAC,* 2004, pp. 442-447 June, 2004.

[5] C. H. Kim, et. al, "On-die CMOS leakage current sensor for measuring process variation in sub-90 nm generations," *Symposium on VLSI Circuits,* 2004, pp. 250-251

We claim:

1. A self-repairing SRAM, comprising:
    an array of SRAM cells;
    an on-chip leakage monitor selectively coupled to said SRAM array for measuring the standby leakage current of the array;
    a comparator responsive to an output signal from said leakage monitor for comparing said output signal to reference values corresponding to low and high inter-die $V_t$ process corners; and a body bias generator having an input coupled to said comparator and an output coupled to a body bias input of said array, wherein said comparator supplies a control signal to said input of said body bias generator to cause said body bias generator to apply reverse body bias (RBB) in an array from a low inter-die $V_t$ process corner and to apply forward body bias (FBB) in an array from a high inter-die $V_t$ process corner.

2. A self-repairing SRAM, comprising:

an array of SRAM cells on a die;

a long inverter chain on the die with said array, said inverter chain having an input and an output;

a counter having first and second inputs connected respectively to said input and said output of said inverter chain, said counter measuring the delay in signal propagation through said inverter chain;

a comparator coupled to said counter for comparing the delay to reference values corresponding to low and high inter-die $V_t$ process corners; and a body bias generator having an input coupled to said comparator and an output coupled to a body bias input of said array, wherein said comparator supplies a control signal to said input of said body bias generator to cause said body bias generator to apply reverse body bias (RBB) in an array from a low inter-die $V_t$ process corner and to apply forward body bias (FBB) in an array from a high inter-die $V_t$ process corner.

3. A method of reducing parametric failures in SRAM, comprising:

measuring the standby leakage current of a SRAM array with an on-chip leakage monitor;

comparing the leakage current of the array to reference values corresponding to low and high inter-die $V_t$ process corners;

applying reverse body bias (RBB) to the array if the comparison indicates a low inter-die $V_t$ process corner; and applying forward body bias (FBB) to the array if the comparison indicates a high inter-die $V_t$ process corner.

4. A method of reducing parametric failures in SRAM, comprising:

providing a long inverter chain on a die with an array of SRAM cells;

measuring the delay in signal propagation through the inverter chain;

comparing the delay to reference values corresponding to low and high inter-die $V_t$ process corners;

applying reverse body bias (RBB) to the SRAM array if the comparison indicates a low inter-die $V_t$ process corner; and applying forward body bias (FBB) to the SRAM array if the comparison indicates a high inter-die $V_t$ process corner.

* * * * *